United States Patent [19]

Baker et al.

[11] Patent Number: 6,070,318
[45] Date of Patent: *Jun. 6, 2000

[54] SURFACE MOUNT PLACEMENT SYSTEM WITH SINGLE STEP, MULTIPLE PLACE CARRIAGE

[75] Inventors: Stuart Baker, Santa Ynez; George Michael Wohlhieter, Escondido, both of Calif.

[73] Assignee: Amistar Corporation, San Marcos, Calif.

[ * ] Notice: This patent is subject to a terminal disclaimer.

[21] Appl. No.: 09/041,539

[22] Filed: Mar. 11, 1998

Related U.S. Application Data

[63] Continuation of application No. 08/699,131, Aug. 16, 1996, Pat. No. 5,743,001.

[51] Int. Cl.⁷ .................................................... B23P 19/00
[52] U.S. Cl. .............................. 29/740; 29/721; 29/741; 29/743; 29/760; 294/64.1; 414/752
[58] Field of Search .............................. 29/740, 721, 720, 29/741, 743, 759, 760, DIG. 44; 294/2, 64.1; 414/752

[56] References Cited

U.S. PATENT DOCUMENTS

| | | |
|---|---|---|
| 4,202,092 | 5/1980 | Shibasaki et al. .......................... 29/741 |
| 4,386,464 | 6/1983 | Yanai et al. ............................ 29/740 X |
| 4,793,707 | 12/1988 | Hata et al. ............................. 29/721 X |
| 4,951,383 | 8/1990 | Amao et al. .............................. 29/721 |
| 5,044,069 | 9/1991 | Asai et al. ............................... 29/740 |
| 5,214,841 | 6/1993 | Howard et al. ........................ 29/743 X |
| 5,323,528 | 6/1994 | Baker ........................................ 29/721 |
| 5,329,692 | 7/1994 | Kashiwagi ............................... 29/740 |
| 5,509,193 | 4/1996 | Nuxoll ..................................... 29/760 |
| 5,743,001 | 4/1998 | Baker et al. ............................. 29/740 |
| 5,743,005 | 4/1998 | Nakao et al. ............................ 29/833 |
| 5,806,174 | 9/1998 | Itoh .......................................... 29/740 |

FOREIGN PATENT DOCUMENTS

| | | | |
|---|---|---|---|
| 3203295 | 9/1991 | Japan ...................................... 29/743 |
| 4123500 | 4/1992 | Japan ...................................... 29/721 |

*Primary Examiner*—Lee Young
*Assistant Examiner*—Minh Trinh
*Attorney, Agent, or Firm*—Gary Cary Ware Freidenrich

[57] ABSTRACT

A surface mount placement system with one or more carriages includes, on each carriage, multiple groups of quills, each group being adjustable on one of two principal orthogonal directions of a plane containing a component mounting zone. The quills of each group are independently rotatable with respect to the quills of the other group and are further independently moveable in a third direction orthogonal to the two principal directions. A carriage is moved to the component mounting zone where the two groups are adjusted with respect to each other for placement of at least two components, one from each group, in a single place step.

22 Claims, 11 Drawing Sheets

SURFACE MOUNT PLACEMENT SYSTEM WITH SINGLE STEP, MULTIPLE PLACE CARRIAGE

This is a continuation of application Ser. No. 08/699,131, filed on Aug. 16, 1996 now U.S. Pat. No. 5,743,001 abandoned.

BACKGROUND OF THE INVENTION

1. Field of the Invention

This invention relates to an electrical component pick and place machine having one or more carriages that pick multiple electronic components, transport the components to a substrate, and simultaneously place multiple components on the surface of the substrate in a single step.

In this discussion, and in the summary, description, and claims that follow, the terms "substrate" and "components" will be used in a broad sense. In this regard, a substrate will be a workpiece on which "components" are placed. Relatedly, a substrate may signify, without limitation, a single printed circuit board (PCB), a panel of PCB's, a ceramic substrate, an additive board, or a flex circuit, or any other equivalent structure. A component is a part that is placed on a substrate, and may be embodied in an electronic device, component, stud, or heat sink, or any equivalent thing.

Moreover, the terms "placement" and "mounting" are synonymous, when used to signify putting components on substrates in particular positions.

2. Discussion of the Related Art

A surface mount placement system with reciprocating turrets is disclosed and claimed in U.S. Pat. No. 5,323,528. The '528 patent is commonly owned with this patent application and is incorporated herein in its entirety by this reference.

The surface mount placement system of the '528 patent describes a surface mount device (SMD) placement system that is used to assemble printed circuit boards (PCB) with surface mount electrical components. The surface mount placement system (SMPS) of the '528 patent includes a table that carries a PCB along a Y axis to a component mounting zone. An elongated rail structure extending parallel to an X axis, and intersecting the Y axis at the component mounting zone, carries left and right turrets that are moveable independently along the X axis, supported by the rail structure. The left and right turrets operate reciprocally, one receiving components from multiple feeder stations while the other places components on a PCB at the component mounting zone. Because the turrets move on the X axis while the PCB moves on the Y axis during placement, the system of the '528 is referred to as a split axis system. A plurality of component pick-up quills is mounted in each turret. Each turret is rotatable about a vertical central axis and each quill is moveable selectibly only along a Z axis that is parallel to the vertical central axis of a turret. In the '528 SMPS, each quill is constrained from rotational movement with respect to the turrets. The quills are constructed to pick up selected electronic components ("pick") from a selected associated component-dispensing mechanism and to mount selected ones of the components at desired locations ("place") on a PCB in the component mounting zone. The turrets are operated so that the quills of either turret are capable of picking components while the quills in the other turret are placing components.

The SMPS of the '528 patent places electronic components very accurately. Further, the rotating turrets of the '528 SMPS are flexible and versatile, handling a large variety of component shapes and sizes with mechanisms that are simple.

Nevertheless, industry demand for increased productivity continues to generate a need for higher speeds of operation. There is an upper limit to the throughput of a SMPS which places a single component in a single place step. Furthermore, there is a need for versatility in placement in that PCBs may need to be populated not in individuated units, but in a panelized unit that may include two or more individual PCBs. In such cases, redundant placements of identical components in identical positions on two or more PCBs in a single panelized unit may be necessary or desirable. Instead of making the placements singly in successive steps, it would be convenient, and faster, to make two or more placements simultaneously, in a single step. Still further, it would be desirable to be able to place multiple components on a single PCB at different locations in a single place step. It should therefore be clear that an accurate and reliable SMPS that places multiple elements in a single place step would constitute a significant advance in the art.

SUMMARY OF THE INVENTION

The invention is based upon the inventors' critical observation that provision of multiple groups of component holder mechanisms that are adjustable independently with respect to each other at the component mounting zone would enable the placement of at least one component from each group in a single place step. Although the groups can have many configurations, the inventors have developed their invention with reference to an SMPS layout of the split axis type. More specifically, the inventors have realized that replacement of a turret with a carriage having multiple rows of component holder mechanisms would support multiple component placement in a single placement step under the conditions that the rows are adjustable in the principal orthogonal directions of a plane containing the component mounting zone and that the component holder mechanisms are rotatable independently with respect to each other.

On the carriage, the component holder mechanisms are, preferably, quills that operate according to known principles to pick up and place individual components. Each group of component holder mechanisms preferably comprises a rack of quills, such that at least two such racks are mounted on the carriage. One rack is adjustable independently in the carriage in a direction (Y') that is parallel to the Y axis. The other rack is adjustable independently in the carriage in a direction (X') that is parallel to the X axis. The quills on each rack are arranged in line, and each rack has provision for rotating its quills, and for raising and lowering its quills in a direction parallel to a Z axis that is orthogonal to the plane containing the component mounting zone. Each quill on each rack therefore is adjustable independently in space with respect to the quills on the other rack.

In accordance with an embodiment of the present invention, a surface mount placement system includes a placement support location for receiving one or more substrates moved to the placement support location along a Y axis, a rail structure substantially parallel to an X axis that intersects the Y axis substantially at the placement support location, and at least one carriage moveable on the rail structure along the X axis to and away from the placement support location. Two or more groups of component holder mechanisms are mounted on the carriage, each group of the two or more groups being separable independently from each other group in a first direction and in a second direction substantially orthogonal to the first direction. Each component holder mechanism of each group further is rotatable on the carriage independently of each component holder mechanism in each other group. Each component holder mechanism further is moveable to and away from the placement support location in a direction that is substantially orthogonal to the placement support location.

Accordingly it is a principal objective of this invention to provide a new and improved surface mount placement system.

A further objective of this invention is to provide an accurate and fast placement mechanism as part of a surface mount placement system.

Yet another objective of this invention is to provide a surface mount placement system having a placement mechanism that mounts multiple components in a single placement step.

Yet another objective of this invention is to provide a component pick and placement mechanism that utilizes two or more independently movable quill racks mounted on a single carriage.

Still a further objective of this invention is to provide an improved surface mount placement system having one or more independent carriages, each with two or more racks, each rack holding a plurality of quills and each rack operable to be adjustable independently with respect to each other rack.

Yet a further objective of this invention is to provide such a carriage in which the quills of each group of quills are rotatable independently with respect to the quills in each other group of quills.

The novel and unobvious features are set forth with particularity in the appended claims. This invention, both as to its organization and manner of operation and use, together with other objects, and advantages than those set forth above, may be best be understood with reference to the following description taken in conjunction with the accompanying drawings in which:

DETAILED DESCRIPTION OF THE PREFERRED EMBODIMENTS

Figure 1:
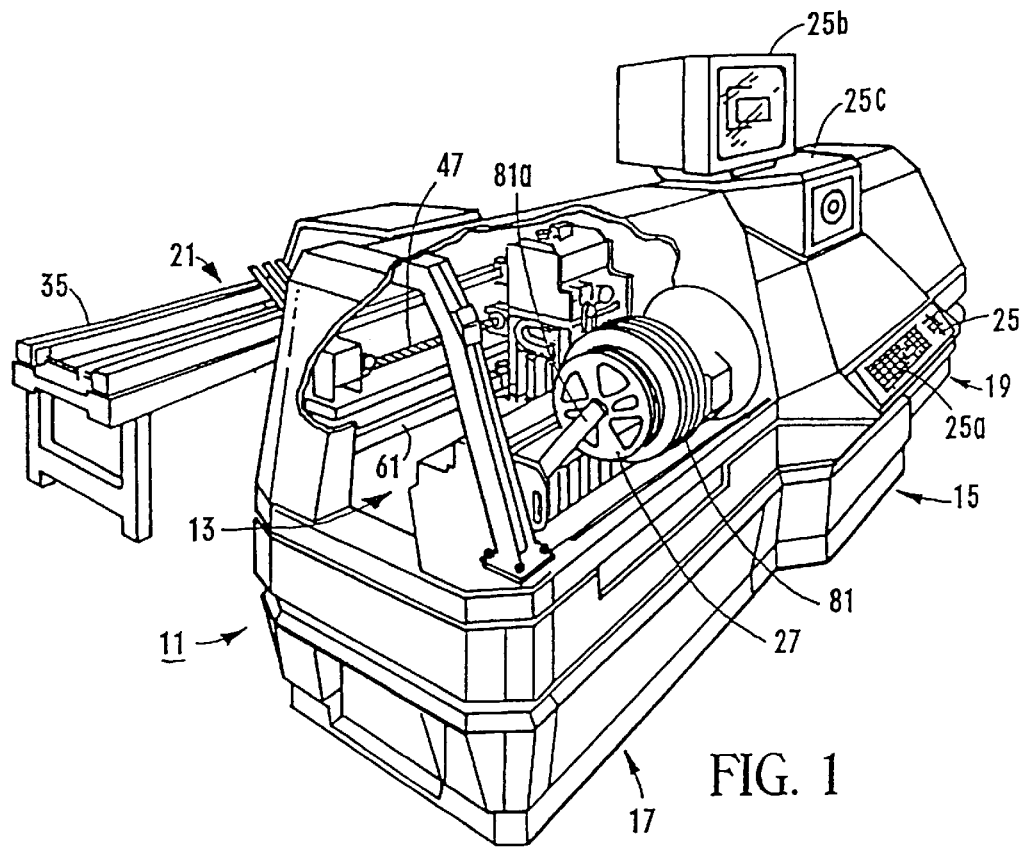
FIG. 1 is a prospective view of a component pick and place machine incorporating the surface mount placement system of this invention.
Figure 2:
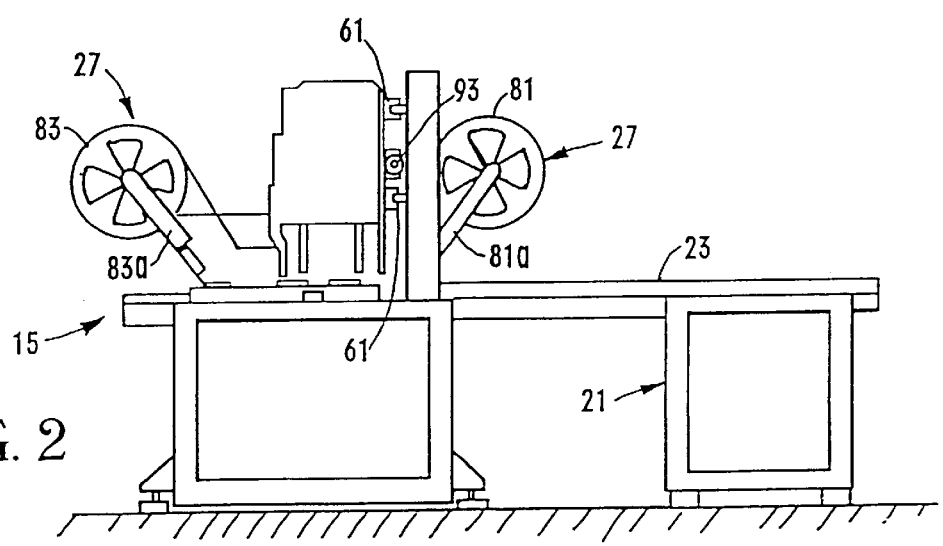
FIG. 2 is right side elevational diagrammatical representation of the component pick and place machine with its placement system of FIG. 1.
Figure 3:
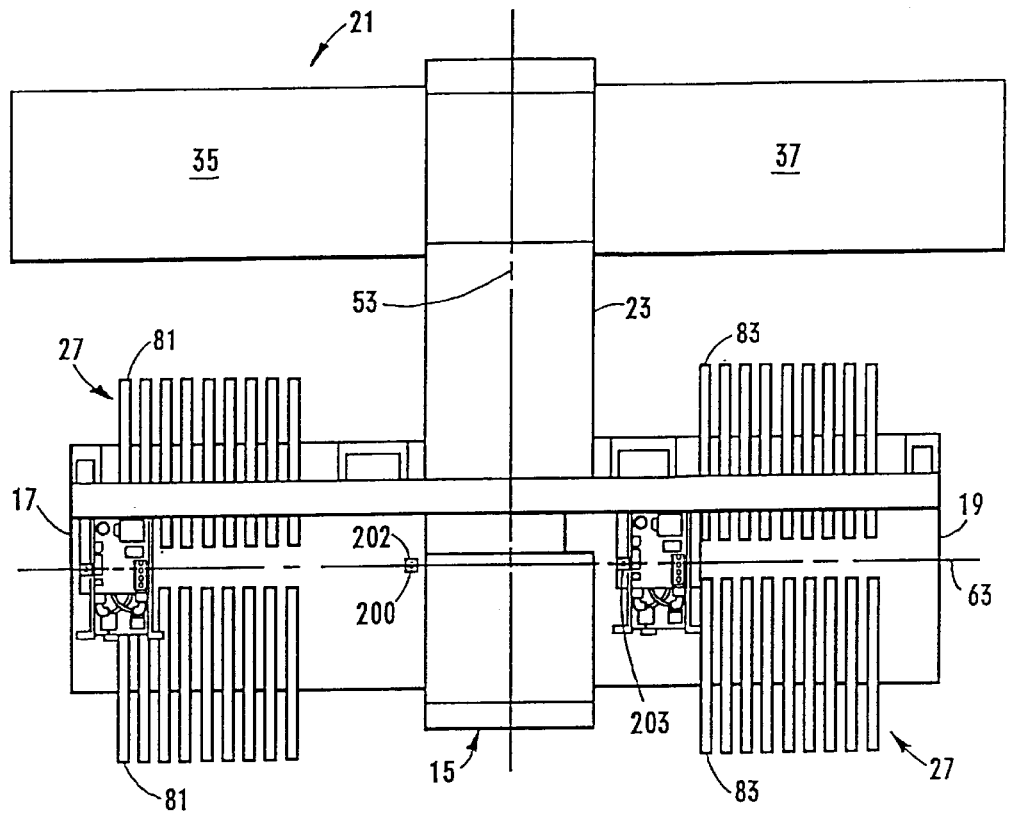
FIG. 3 is a diagrammatical representation top plan view of the system shown in FIG. 1.

Referring now to the drawings and more particularly to FIGS. 1–4, there is shown a component pick and placement machine 11 including a surface mount placement system generally identified by reference numeral 13.

The machine 11 includes a main central section 15, a main left side section 17, a main right side section 19, a generally parallel rear substrate conveyor section 21, and a central connecting section 23 orthogonal to the main central section 15. The main central section 15 also includes a control console 25 including a conventional keyboard 25a with a cursor controller such as a track ball, and video displays 25b and 25c. Conventional component input supply reels, tubes, and tray feeder stations 27 are mounted at the front and rear of both the left and right side sections 17 and 19, respectively.

The rear substrate conveyor structure 21 includes an input conveyor section 35 and an output conveyor section 37, each configurable for left-to-right or right-to-left operation. The main and side sections 15, 17, 19 are constructed as disclosed in the incorporated '528 patent.

Figure 5:
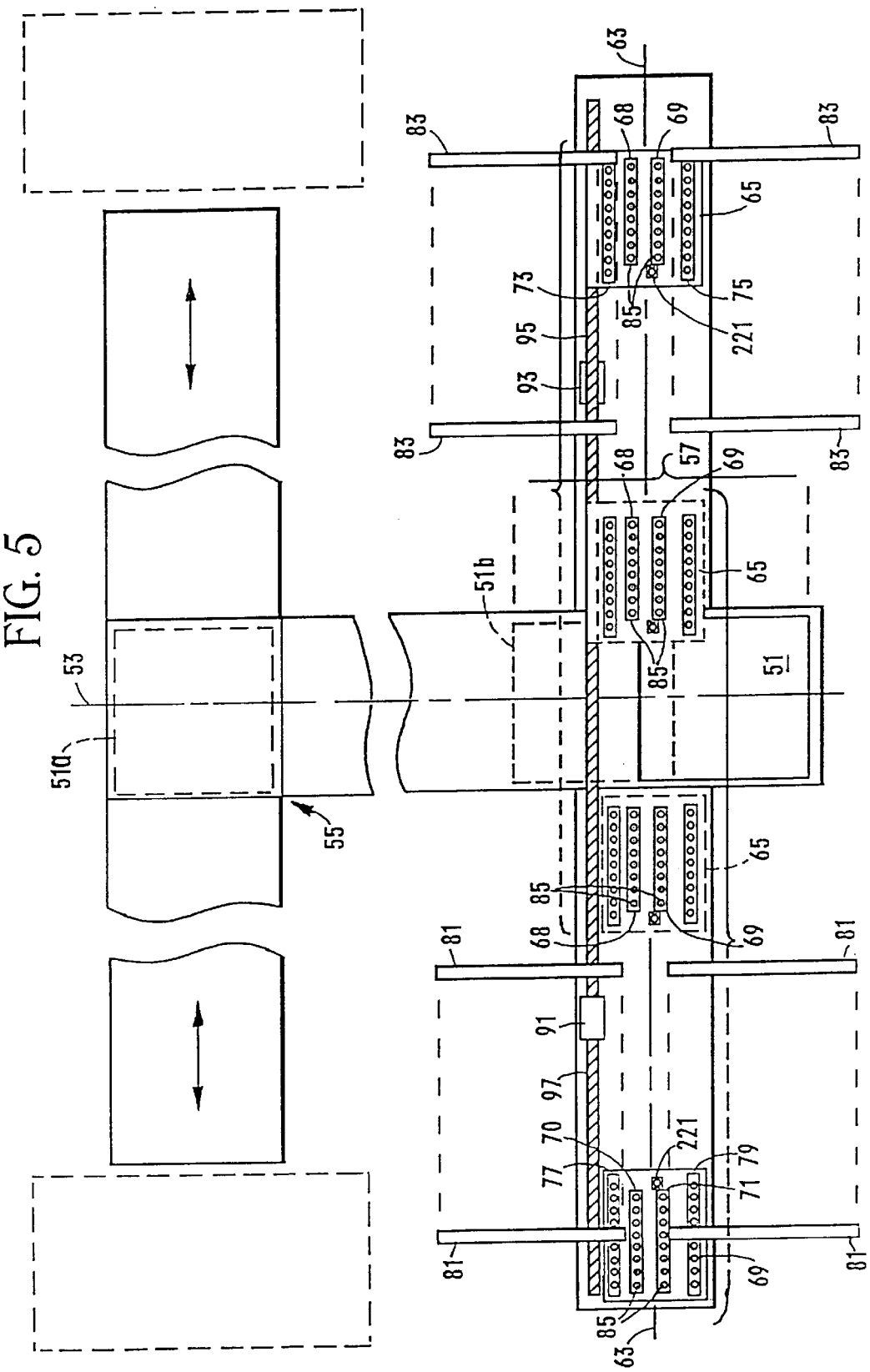
FIG. 5 a schematic representation of basic elements of the surface mount placement system in accordance with this invention.

In order to describe the invention as embodied in the surface mount placement system 13 more clearly, reference is now made to FIG. 5. Here a table 51 is shown movable along a Y axis, indicated by reference numeral 53. The table 51 is shown in dashed outline 51a in a position 55 at which components may be mounted to it. This position 55 is adjacent its most rearward extent of travel. Solid outline 51 and dashed outline 51b show the table 51 in its leading edge placement support location and trailing edge placement support location, respectively. A component mounting zone 57 extends between the most rearward edge of the table when at placement support location 51 and the most forward edge of the table when at placement support location 51b. The component mounting zone 57 is defined essentially by a plane in which a substrate surface is located for placement of electronic components.

The table 51 is constructed and driven as described in the incorporated '528 patent.

An elongated carriage rail structure with twin rails 61 (shown in FIGS. 1, 2, and 6) extends parallel to an X axis (line 63 in FIGS. 3 and 5) and intersects the Y axis 53 about in the middle of the component mounting zone 57. A right carriage 65 and a left carriage 67 are mounted independently on the rail structure and are movable along the X axis, each carriage carrying two or more groups of component holder mechanisms (quills).

Figure 6:
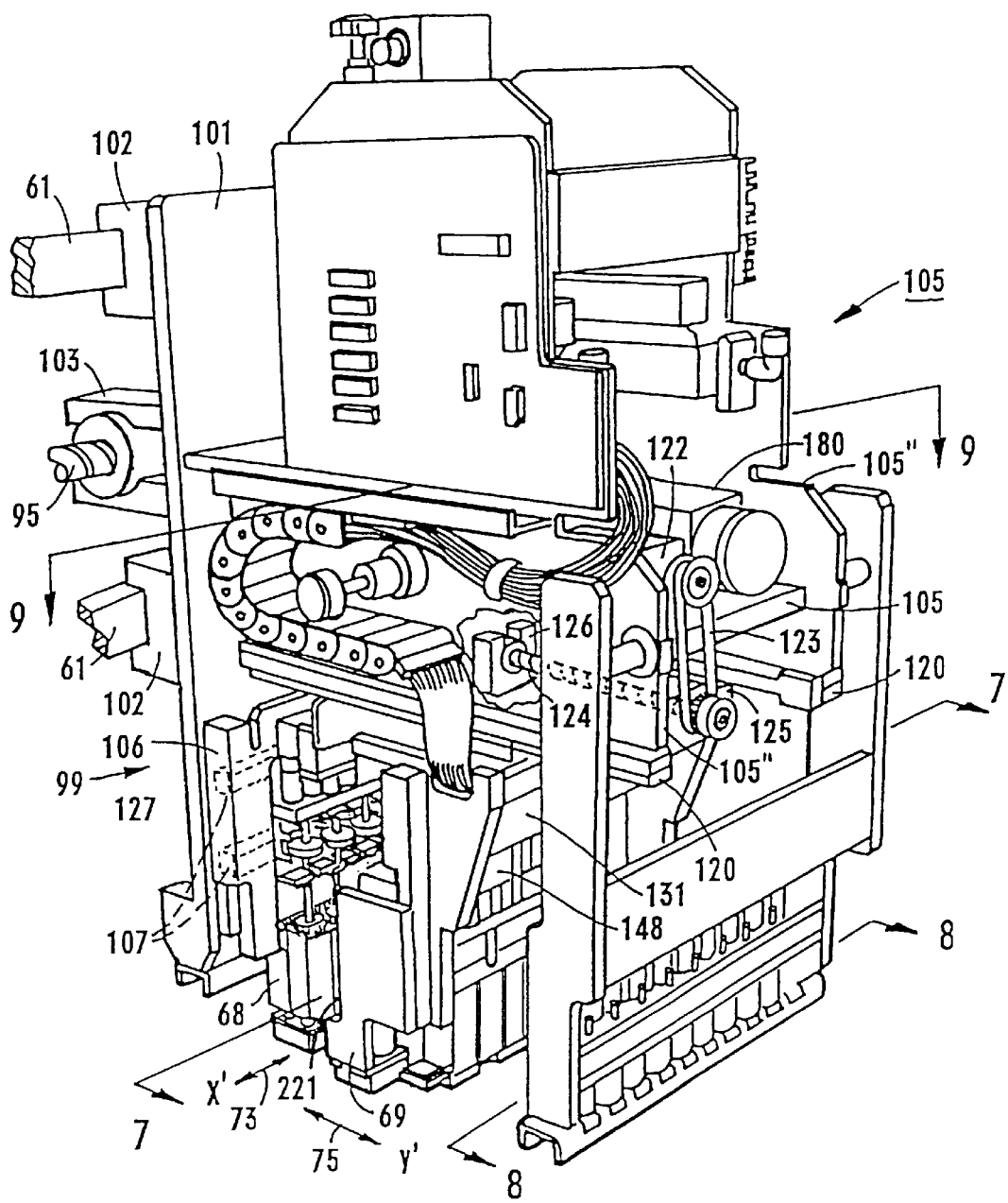
FIG. 6 is an enlarged prospective diagrammatical view of a portion of an independently moveable carriage of the surface mount placement system.

In the preferred embodiment, two groups of quills are mounted to each of the carriages 65 and 67. Although the preferred embodiment shows two groups of quills on each carriage, this is not intended to so limit the invention. Preferably, mounting of the groups of quills is by elongate racks. Relatedly, the right carriage 65 has mounted on it two racks 68 and 69, each carrying a respective group of quills. The left carriage 67 has mounted on it two racks 70 and 71, each carrying a respective group of quills. As indicated in FIG. 6, on each carriage, each rack is independently separable from the other rack. In the preferred embodiment this is provided by making one rack positionable selectively in a direction X' independently of the other rack, while the other rack is positionable selectively in a direction Y' that is orthogonal to the direction X', independently of the first rack. This is represented in FIG. 6 by the arrow 73 that represents the direction X' in which the rack 68 can be positioned independently of the rack 69. Further, the rack 69 can be positioned in the direction indicated by the arrow 75, which represents the Y' direction (orthogonal to the X' direction). In the preferred embodiment, the inventors have found it convenient to make the directions X' and Y' parallel, respectively, to the directions X and Y. These directions are the principal orthogonal directions of the plane of the component mounting zone 57. As will be disclosed in more detail, each group of quills further can be positioned independently by rotation about their associated Z-oriented central axes and by vertical positioning along their Z-oriented central axes. In this regard, Z is the direction that is orthogonal to X (and X') and to Y (and Y'), and therefore to the plane of the component mounting zone 57.

Manifestly, the component mounting zone encompasses the entire set of locations where a carriage overlaps a substrate—partially or wholly—for placement of components. In the preferred embodiment this includes all of the component placement locations where a carriage and a substrate overlap due to movement of either or both. Relative movement between a carriage and a substrate in a component zone may be broadly provided by movement of only the substrate or only the carriage, or both.

Figure 8:
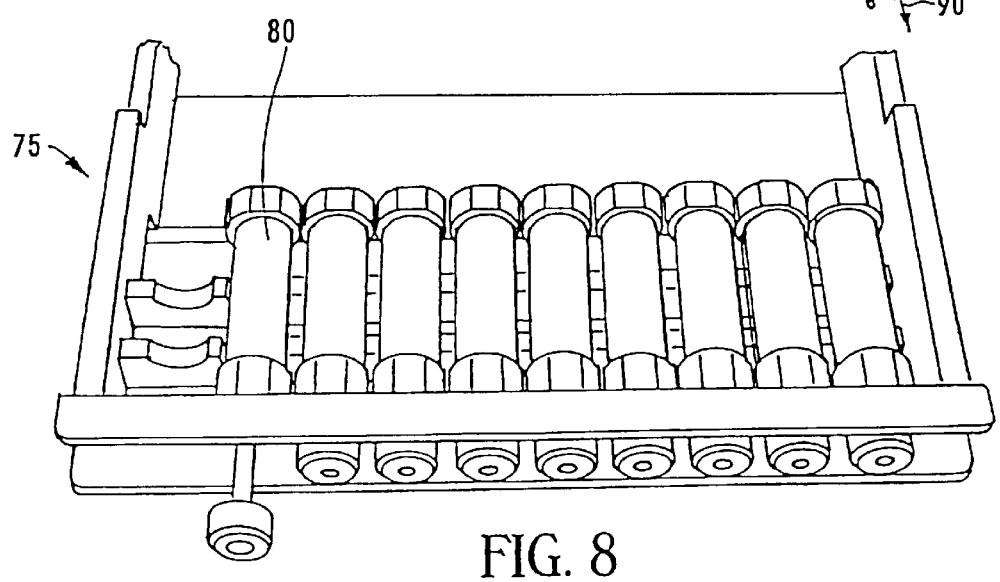
FIG. 8 is sectional drawing of the carriage illustrated in FIG. 6 taken along lines 8—8.

Also mounted to each carriage are two racks of actuators. In FIG. 5, the carriage 65 has actuator racks 73 and 75, while the carriage 67 has actuator racks 77 and 79. The actuator racks 73, 75, 77 and 79 are stationary on the carriages 65 and 67; each is mounted between a lateral edge of a carriage and a moveable rack of quills. As shown in FIG. 8, each actuator rack contains a linear array of pneumatically-operated actuators 80 that cooperate with tape feeder stations 27 to selectively provide components for pickup by the quills.

The invention also includes left and right multiple feeders supplied by reels 81 and 83 supported by associated arm members 81a, 83a (in feeder station 27) that are disposed on opposite sides of the Y axis 53 and centered about the X axis 63.

Figure 7:
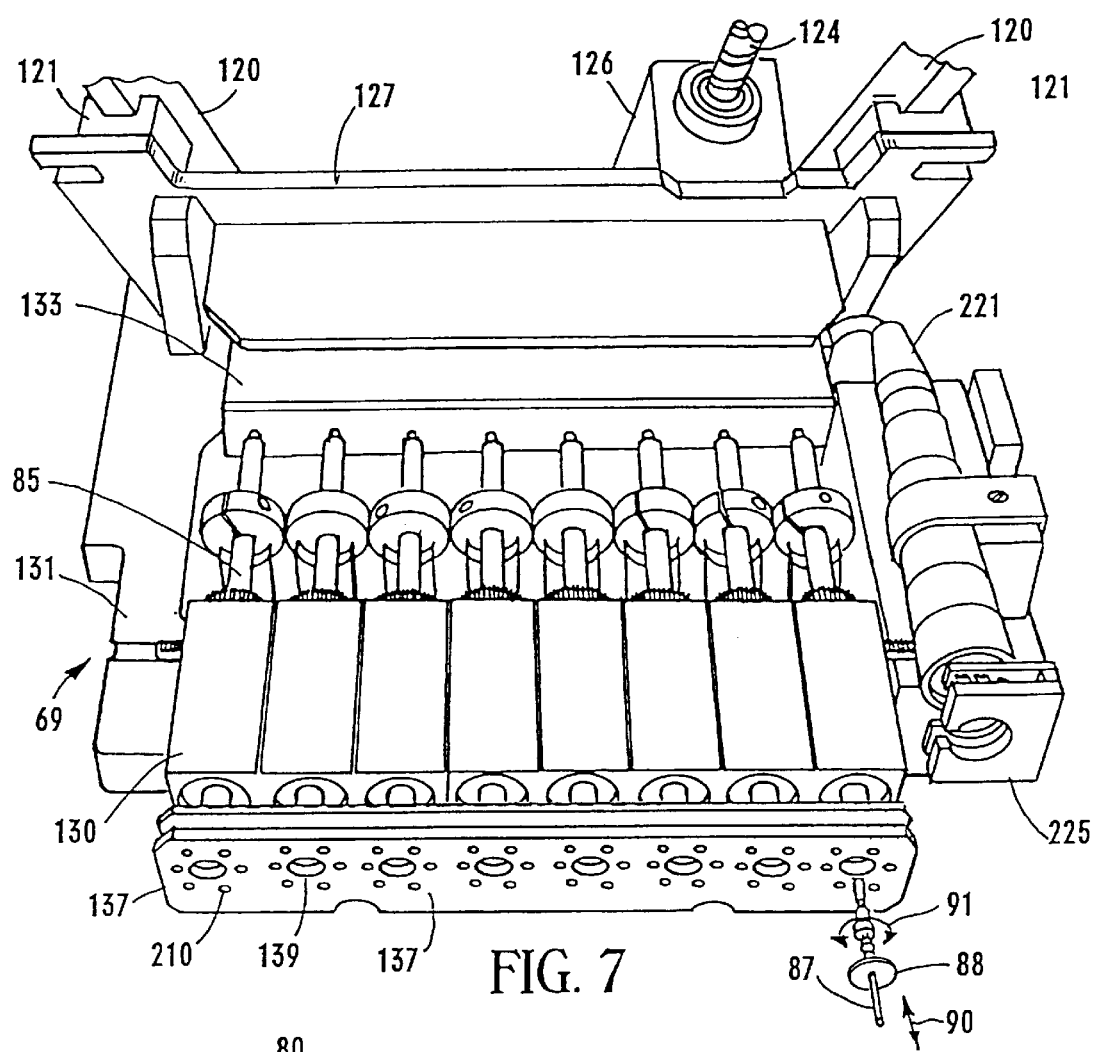
FIG. 7 is a sectional drawing of the carriage illustrated in FIG. 6 taken along lines 7—7.

With reference to FIGS. 5, 7, 10 and 11, the group of quills in each rack includes a plurality of conventional component vacuum pick-up quills 85. In the preferred embodiment, eight quills are in each rack. Obviously, more or fewer quills can be provided in a rack without departing from the spirit of this invention. Each quill is provided with a conventional vacuum nozzle 87 tailored to the component to be picked. The vacuum nozzle 87 is removable from the tip of a quill 85. Each vacuum nozzle 87 is part of a nozzle unit that includes a translucent (preferably plastic) disk 88. Although the figures show only a single quill equipped with a nozzle unit, it should be understood that, in operation, all quills of each rack will be so equipped. Each of the quills 85 is moveable selectibly along a Z axis. Each of the quills 85 further is rotatable in its rack, with the axis of rotation being defined by the axis along which the quill moves. In FIGS. 7 and 11, the Z axis is represented by the arrow 90, while rotation is indicated by the arc 91. Each of the quills 85 is moveable selectably along the Z axis and rotatable on the Z axis to: (1) pick up selected components from a selected associated one of the component dispensing feeders 81, 83 and (2) place selected components at desired locations on a substrate carried on the table 51 in the component mounting zone 57.

Figure 4:
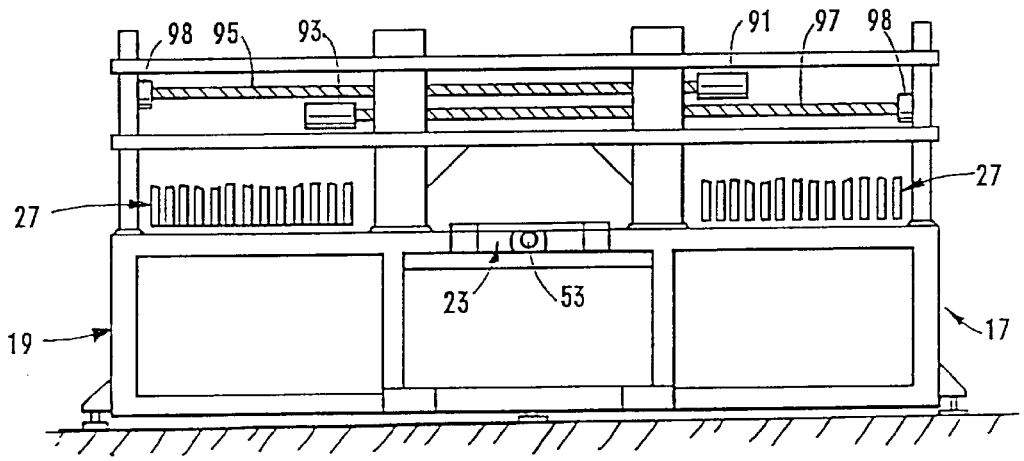
FIG. 4 is a rear diagrammatical view of the system of FIG. 1.
Figure 9:
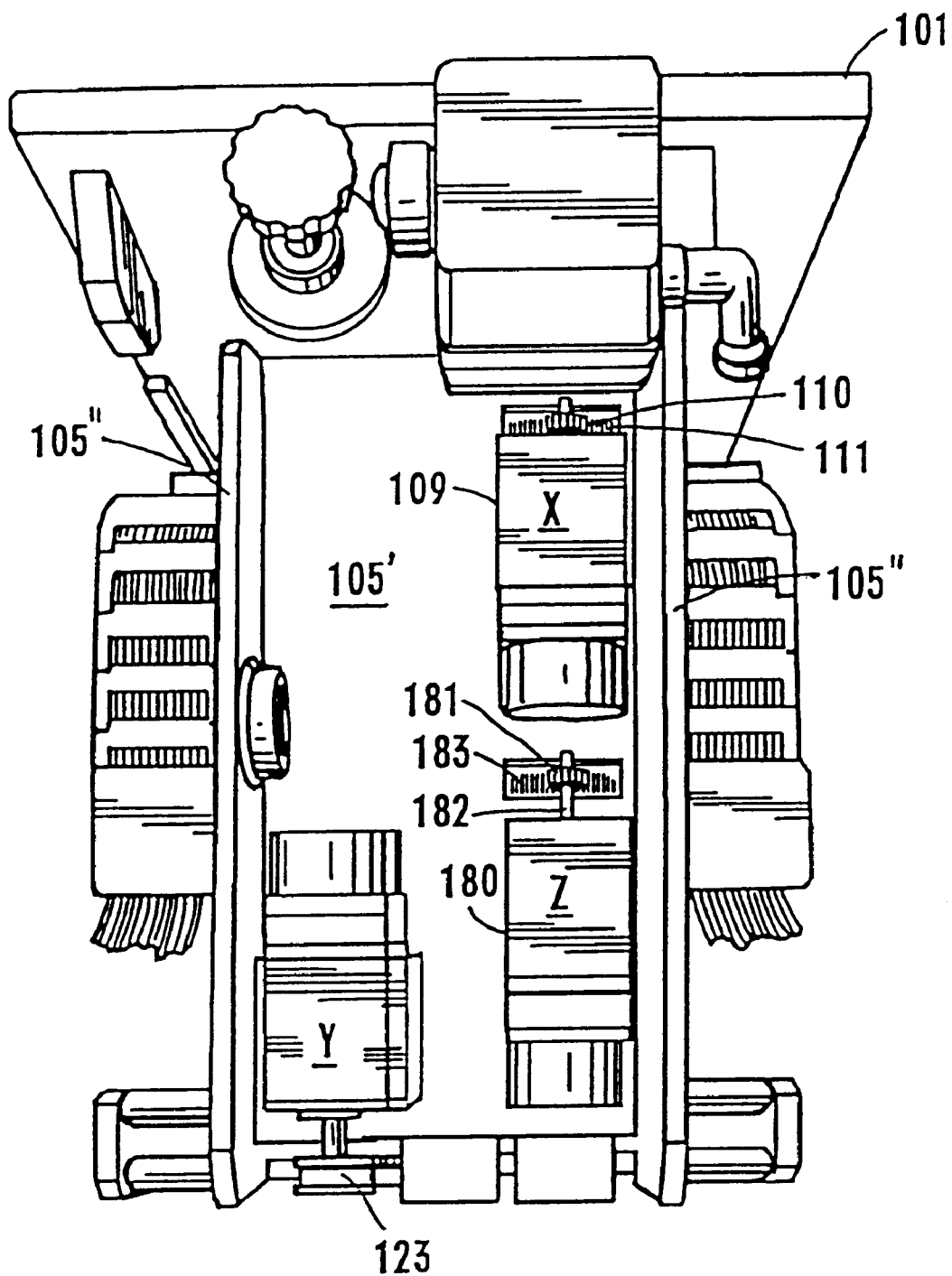
FIG. 9 is a sectional drawing of the carriage of FIG. 6 taken along lines 9—9.
Figure 12:
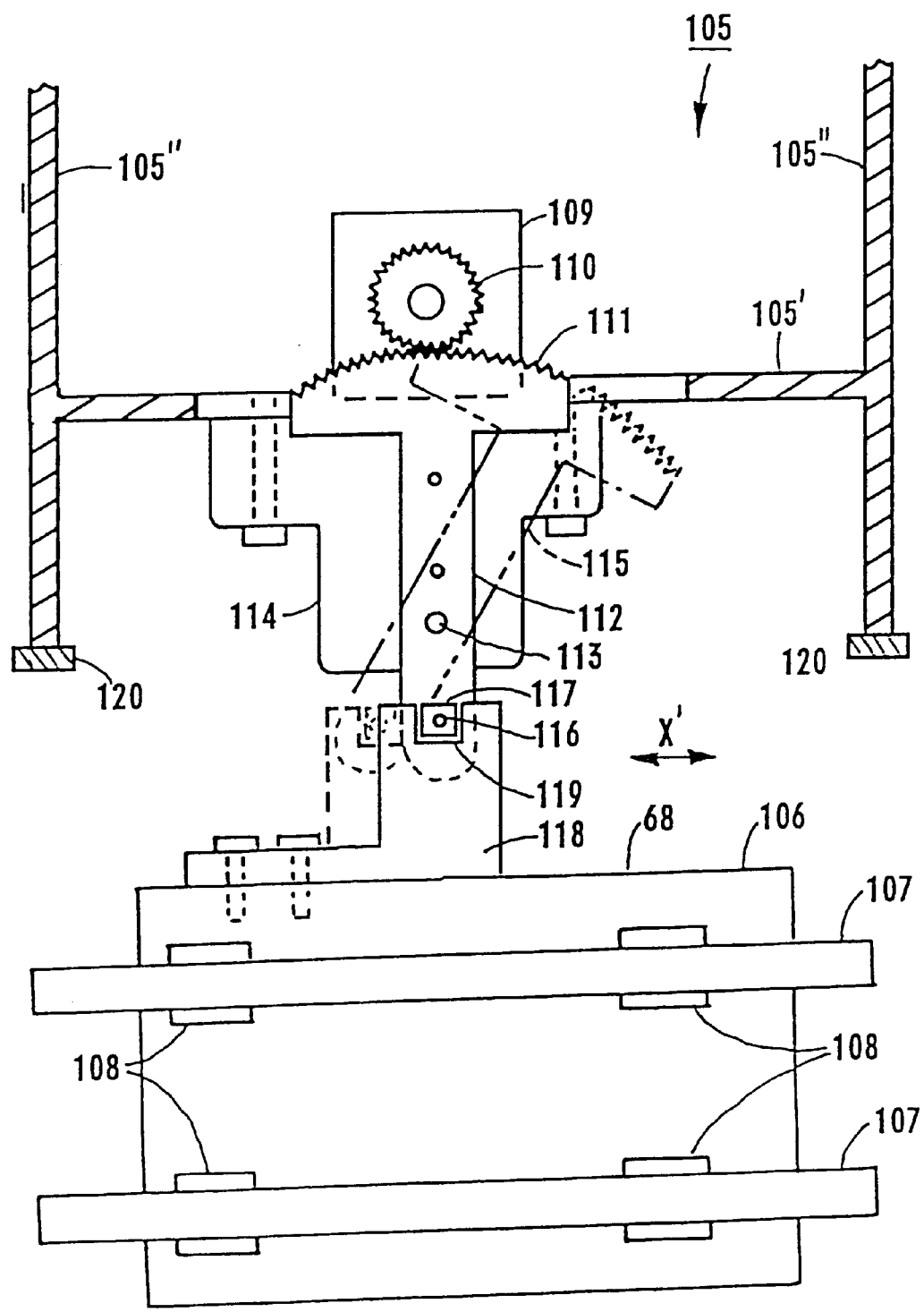
FIG. 12 is a partially schematic illustration showing details of a means for moving a rack of quills in X' on the carriage of FIG. 6.

The carriage rail structure includes a dual set of precision rails 61 that extend just beyond the left and right component feeder stations 27. Each of the carriages 65, 67 is driven in either direction parallel to the X axis by a motor/screw combination best seen in FIG. 4. FIG. 4 is a rear diagrammatical view of the system of FIG. 1 that schematically shows servo motors 91, 93, each direct coupled to an associated large diameter lead screw 95, 97, respectively. The lead screws are disposed in a parallel relationship, with the lead screw 95 disposed above the lead screw 97. The servo motor 91 is coupled drivingly to one end of the lead screw 95, whose other end is journalled in a bearing structure 98. The other lead screw 97 is driven similarly and supported. The lead screw 95 drives the carriage 65 on the rails 61, parallel to the X axis. Carriage 67 is driven similarly by the lead screw 97. The relationship between the rails 61, the lead screw 95, and the carriage 65 is illustrated in FIG. 6, it being understood that the carriage 67 is constructed and operated similarly. The carriage 65 is mounted to a main support structure 99 which includes a flat plate 101 to which bearings 102 are mounted that engage and ride on the rails 61. The flat plate 101 has mounted to it a conventional threaded collar indicated by 103, threadably engaged with its associated large diameter lead screw 95 for movement of the carriage 65 in each X direction. The main support structure 99 of the carriage 65 also includes a main body frame 105 that supports means necessary for respective X' and Y' movement of the racks 68 and 69 on the carriage 65. In this regard, as is seen partially in FIGS. 6 and 9 and as is shown in more detail in FIG. 12, means for positioning the rack 68 in either direction along X' are shown. Relatedly, the rack 68 is mounted on a moveable plate 106 that faces the flat plate 101. Twin rails 107 are mounted on the flat plate 101 and are engaged slidably by bearing 108 mounted to the back plate 106. An X servo motor 109 is mounted fixedly to an upper surface of a plate 105' that is part of the main body frame 105. A cogwheel 110 fixed to the end of the driveshaft of the motor 109 engages an upper, toothed arcuate section 111 of a pivoted driving member 112. The driving member 112 is pivoted at 113 by a pin extending from a pivot attachment plate 114 that is attached fixedly to a bottom surface of the plate 105'. The pivot 113 engages a lever arm 115 of the driving member 112 that is attached at one end to the toothed arcuate section 111. At the other end of the lever arm 115 is a pin 116 on which a driving piece 117 pivots. An engagement piece 118 attached fixedly to a top edge of the plate 106 includes a recess 119 that is shaped to receive and engage the driving piece 117.

The X' drive means just described enables X' positioning of the rack 68 as follows. When the driveshaft of the servo motor 109 is rotated in either direction, the cogwheel 110, engaged to the toothed arcuate section 111 of the drive member 112, causes the drive member 112 to pivot on the pivot 113. As the drive member 112 pivots, the end of the lever arm 115 travels in an arcuate direction, carrying with it the engagement piece 117. The engagement piece, received in the recess 119, urges the rack 68 along the rails 107 in either direction along the X' axis.

As seen in FIGS. 6 and 7, means for positioning the rack 69 in either Y direction are shown. In this regard, the rack 69 is driven in either direction along Y' on rails 120 that are mounted fixedly at respective lower edges of side walls 105" of the main body frame 105. The rack 69 includes conventional bearings 121 that engage and ride on the rails 120. The rack 69 is driven on the rails by a servo motor 122 mounted on the upper surface of the plate 105' and coupled, by way of belt 123, to a lead screw 124. The lead screw is supported by bearing structures, one of which is indicated by 125, that are mounted fixedly to the main body frame 105. As partially seen in FIG. 6, a threaded collar 126 that is mounted fixedly to a top plate 127 on the rack 69 threadably engages the screw 124. In response to rotation of the screw 124 by the servo motor 122, the rack 69, engaged to the screw 124 by the threaded collar 126, is moved selectively in either direction along the Y' axis on the rails 120.

Figure 11A:
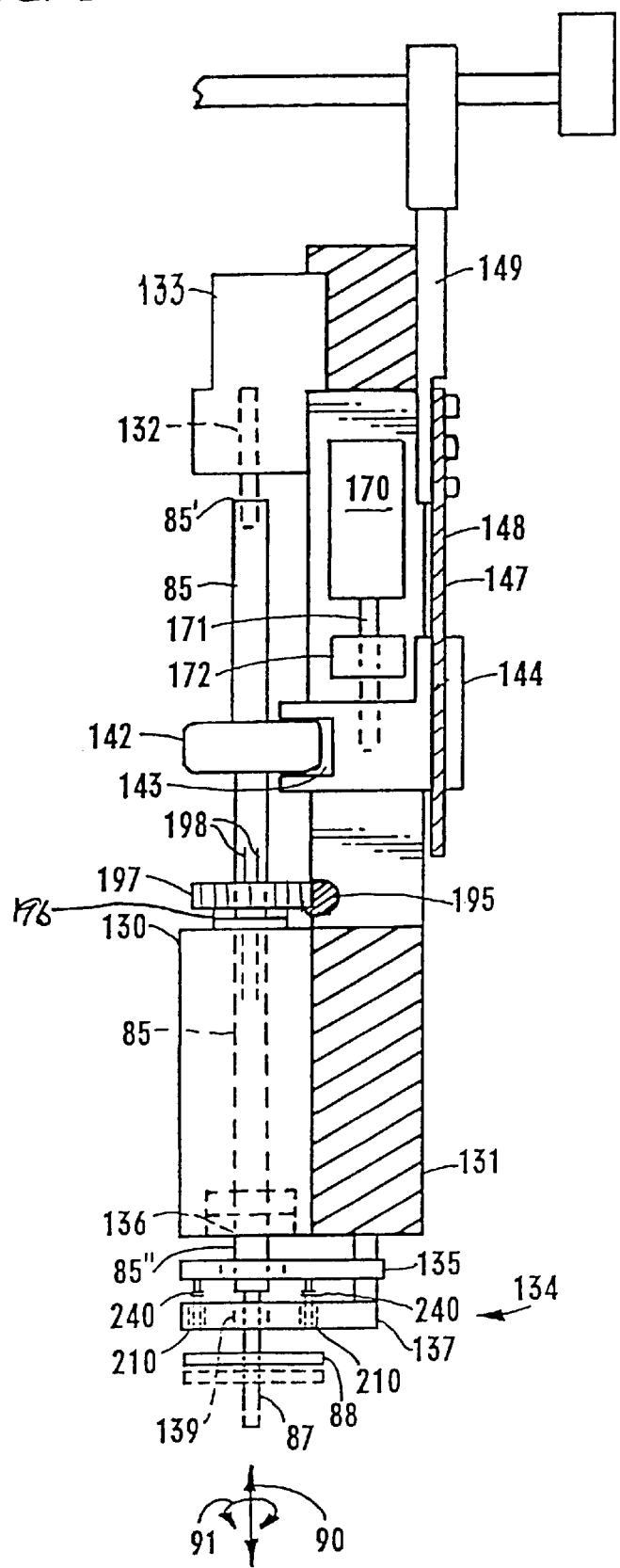
FIGS. 11A and 11B are partially schematic illustrations showing details of a means for moving quills in Z on the carriage of FIG. 6.

Means for providing Z axis movement of the quills 85 can be understood with reference to FIGS. 7, 9 and 11A–11C. This description is made with respect to one quill 85 on the rack 69, with the understanding that it applies to all quills on all racks of both carriages. As best seen in FIGS. 7 and 11A, the quill 85 has a top end 85' and a bottom end 85". The quill is a hollow stainless steel tube that is engaged slidably in a journal box 130 mounted to a plate 131. The plates 127 and 131 are joined to form a rack frame structure. The journal box 130 is a housing that includes upper and lower bearings which slidably support the quill 85. The upper end 85' of the quill is connected, through a coupling 132 that runs through a vacuum manifold 133, to a conventional vacuum apparatus that selectably provides a vacuum to each quill on the carriage 65. The vacuum manifold 133 contains eight individual vacuum couplings that communicate the respective vacuums to the eight quills that are mounted on the rack 69. A vacuum is communicated through each quill 85 and its associated nozzle tip 87 for pick up and retention of an electronic component. The bottom end 85" of the quill 85 passes through a nozzle tip illuminating structure 134 that is mounted to the plate 131, beneath the journal boxes 130. The elongate, nozzle tip illuminating structure 134 includes a printed circuit board 135 and a light diffusing rectangular plate 137 with eight openings 136 and 139 respectively allowing the upper end of vacuum nozzle 87 passage to be received into the lower end 85" of quill 85. The illuminating structure 134 is further described elsewhere. As shown in FIG. 11A, the vacuum nozzle 87 with translucent disk 88 being positioned beneath the light diffusing rectangular plate 137.

Figure 11B:
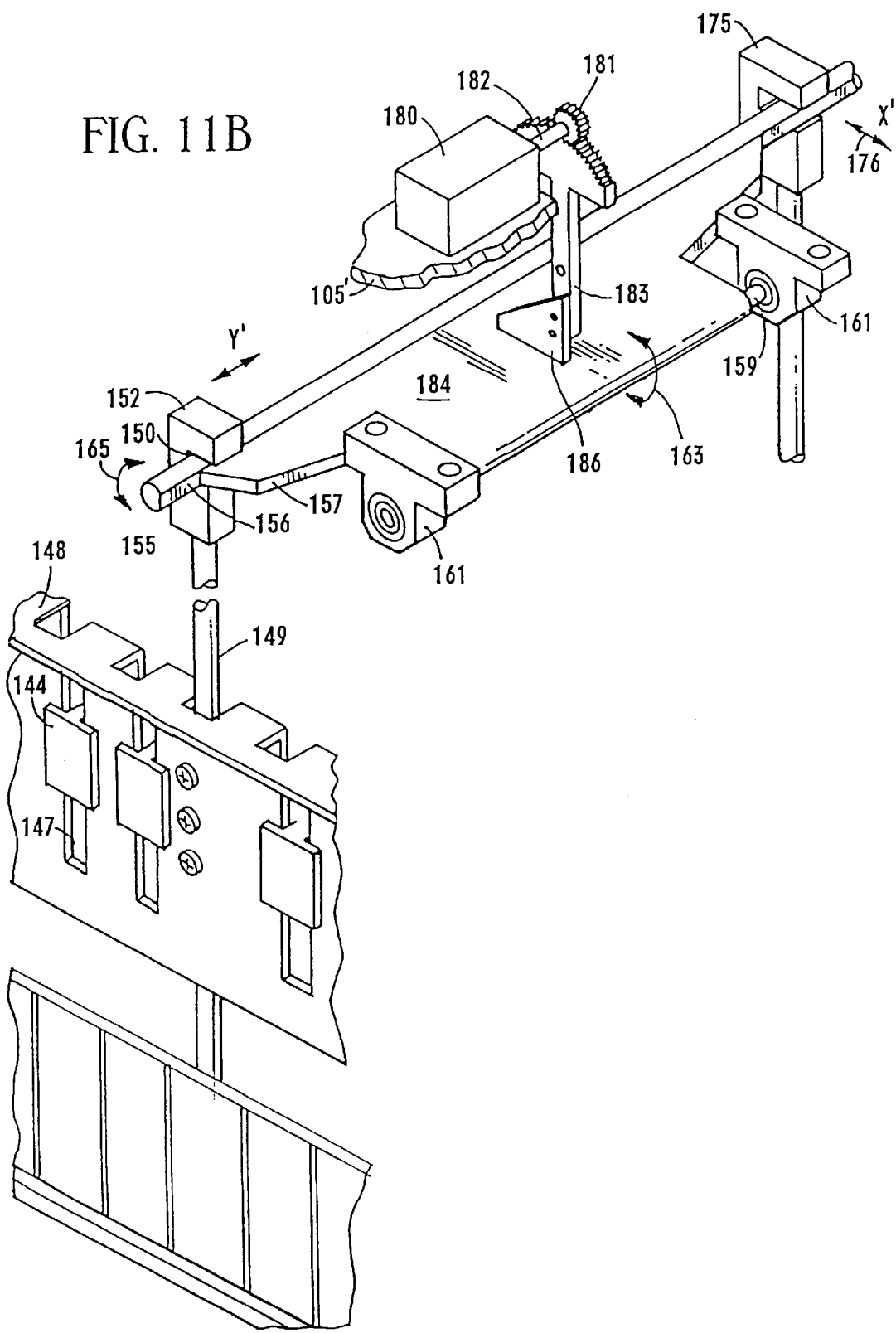

For Z positioning, an annulus 142 is fixed to the outer surface of the quill 85 to be concentric therewith. The annulus 142 is engaged in a notch 143 of a clevis 144. Each clevis 144 of each quill in the rack 69 is engaged in respective notch 147 of an elongate rectangular plate 148 that is mounted conventionally to the plate 131 for slidable movement thereon. With reference now to FIG. 11B, the lower end of a shaft 149 is fixed to the plate 148. Another clevis 152 is attached to the upper end of the shaft 149. The clevis 152 includes a notch 150 that slidably engages a shaft 155. The shaft 155 is attached to an elongate edge 156 of a pivoted, swinging plate 157. An edge of the plate 157 opposite the edge 156 is fixed to a shaft 159 that is hinged in a pair of bearing assemblies 161. The bearing assemblies are attached to the bottom surface of the plate 105' of the main body frame 105. This structure allows the plate 157 to be pivoted about by the shaft 159, as indicated by the arc 165. Pivoting of the plate 157 is translated by the clevis 152 into an up and down motion of the plate 148.

The plate 148 initially moves to an upper position in which the clevis 144 is engaged at the bottom of the slot 147 and moved upwardly, lifting the quill 85 to a fully retracted position as indicated by the solid outline of the quill tip assembly in the FIG. 11A. To move the quill 85 downwardly, the plate 148 is moved downwardly thereby freeing the clevis 144. When freed, the clevis 144 is urged downwardly by a pneumatic actuator 170 or is secured upwardly by vacuum applied to the same pneumatic actuator 170. The pneumatic actuator 170 is controlled conventionally to exert a downward force on the shaft 171 by way of an annulus 172 that engages on the top side of the clevis 144. This moves the clevis 144 downwardly with a force that is controllable selectably by control of the pneumatic cylinder 170. When the cylinder 170 is deactivated, the plate 148 is raised, again engaging the bottom of the clevis 144, raising it upwardly.

The means for moving the plate 157 and imparting control of Z axis movement to the racks 68 and 69 include a Z-axis servo motor 180 mounted on the plate 105' of the main body frame 105. A cogwheel 181 attached to the driveshaft 182 of the motor engages a drive member 183 that is identical essentially to the drive member 112. The drive member 183 is coupled to an upright, triangular piece 186 that is mounted on the plate 157. The engagement between the drive member 183 and the triangular piece 186 in its essential respects, is as described above for the driving member 112.

It should be evident that each quill, having a dedicated pneumatic actuator, is positionable on its Z axis independently of any other quill on its rack, and any other quill or any other rack.

With this arrangement, when the plate 148 is in its raised position, all eight devises of the rack are engaged, raising all quills to the same Z location and preventing them from moving in Z. When the plate 148 is lowered, the quills are positionable individually in Z in response to their pneumatic actuators. Typically, at a place location, only the pneumatic actuator of the quill holding the electronic component to be placed would be moved downwardly along its Z axis to position its electronic component for placement, whereupon the vacuum on the quill would be deactivated, thereby placing the component.

The X' and Y' motions of the racks 68 and 69 are accommodated in the means for Z positioning of the quills as illustrated in FIG. 11B. In this regard, the clevis 152 that cooperates in Z positioning of the quills in the rack 69 is not fixed to the shaft 155, and thereby is free to translate longitudinally along the shaft as the rack 69 is positioned along the Y' axis. For the rack 68, which translates in either direction along the X' axis, the clevis 175 moves radially with respect to the shaft 155, as indicated by the arrow 176. The U-shaped portion of the clevis 175 is deep enough to fully engage the shaft 155 throughout the full range of adjustment along the X' axis.

Figure 10:
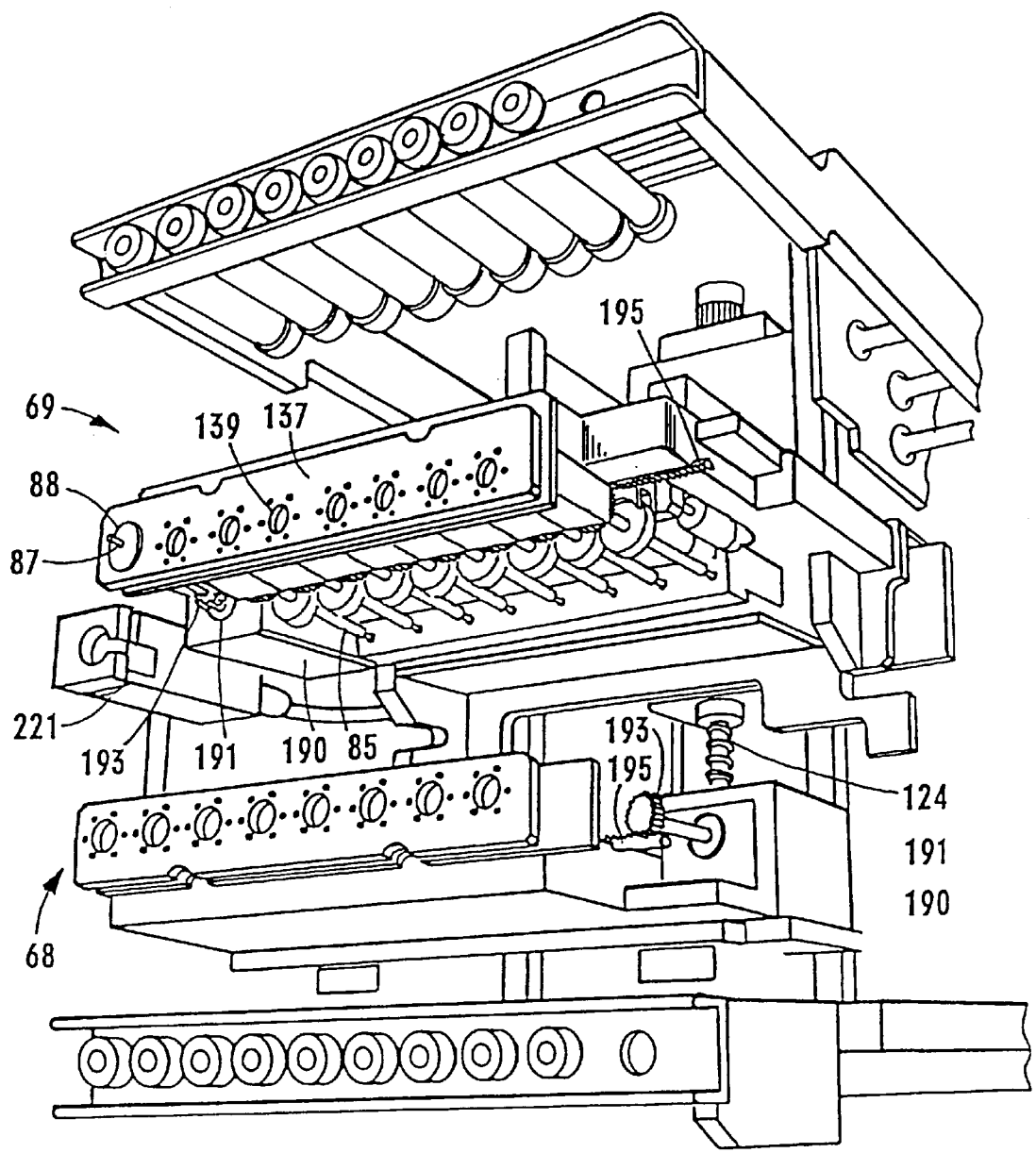
FIG. 10 is a perspective view of the carriage of FIG. 6, looking upwardly from beneath the carriage.

Means to rotate the quills 85 on the Z axis are illustrated in FIGS. 7, 10, and 11A. In this regard, each rack has mounted to its plate 131 a rotation servo motor 190. Each of the rotation servo motors 190 has a drive shaft 191 to which a cogwheel 193 is attached. Each cogwheel 193 engages a toothed shaft 195. As a servo motor 190 operates, the associated shaft 195 is moved in one direction or the other along its axis. As seen in FIGS. 7, 10, and 11A, each journal box 130 has mounted to it a bearing assembly with 196 a cogwheel 197 that engages a toothed shaft 195 in a conventional rack-and-pinion arrangement. Axial movement of the shaft 195 rotates the cogwheel 197, and, with it, a quill 85. The inner circumferences of the bearing assembly 196 and cogwheel 197 (not shown) have lands (not shown) that engage grooves 198 on the outer surface of the quill 85. The land-and-groove engagement allows vertical movement of the quill 85 and thereby accommodates Z-axis adjustment of the quill without decoupling the quill from the means for rotational adjustment.

Manifestly, in the preferred embodiment, all quills of a rack are rotated simultaneously. This provides a very compact means for rotation of the quills and does not detract from the operation of the invention, since only one quill at time is positioned for placement. The inventors, nevertheless, contemplate that the quills of a rack may be rotated individually by means well known in the art.

In this multi-rack configuration, each carriage has full access to the entire width of any substrate supported by the table 51 in the component mounting zone 57. Further, the left carriage 67 has access to all of the feeders 81 on the left side of the machine, while the right carriage 65 has access to all right side feeders 83. Moreover, while the vacuum quills 85 of the right carriage 65 are placing components on a substrate, the vacuum quills 85 of the left carriage 67 simultaneously pick up components from the left side feeder, and vice versa.

Also, in accordance with the invention, the spacing between the pick points of the component dispensing feeders 81, 83 exactly coincides with the spacing between the vacuum nozzles of the quills 85 so that as many as 16 components, eight in each rack, may be picked up simultaneously.

In operation, as shown in FIG. 5, as the right carriage 65 is placing components on a substrate in the component mounting zone 57, the left carriage 67 first picks up desired components from its feeders before moving to a visualization location where an upward looking video camera 200 of a conventional vision pattern recognition system 202 is placed for position measurement of each component on the respective vacuum nozzles 87 of the left carriage 67. The vision system 202 operates conventionally and includes a right side upward looking video camera 203 at a visualization location just to the right of the table 51 in the component mounting zone 57 in order to determine position of components picked up by the right carriage 65.

With the exact position and rotation of the components known from the output of the upward-looking vision system 202, the right carriage 65 and the Y table 51 are corrected by conventional computational means for positional or rotational errors of component locations, before the servo motor 93 is again actuated to move the carriage 65 over the table 51 in the component mounting zone 57 for placement of components on a substrate in the zone. In the meantime, the left carriage 67 is picking the next set of components from the left side multiple feeders.

Each carriage 65, 67 includes a conventional downward looking video camera 221 that is carried at the leading edge of the rows of quills on a carriage. Each video camera 221 is connected to the vision pattern recognition system 202. Both video cameras 221 are mounted on their respective carriages and have a field of view of either a substrate, or a respective component pick-up location through an aperture 225. Each downward looking video camera 221 and its associated aperture 225 is mounted to the rack assembly of the respective carriage rack that adjusts in the Y' direction. This is not intended to so limit the location of these cameras. The vision pattern recognition system 223 is used independently to locate conventional board fiducials prior to part placement in order to calculate component location offsets in X, Y, and rotation angle. Additionally, local fiducials for large components, especially fine pitch components, are located with each carriage's downward looking video camera 221 for more precise matching of copper pads and component leads. Fiducials may be of any design and are incorporated into well-known techniques to determine location offsets.

In accordance with this invention, illumination that enables the upward looking video cameras 202, 203 to determine location and rotation of components can be understood with reference to FIGS. 7 and 11A. In this regard the components are backlighted from a light source mounted on the rack of a carriage. Specifically, the elongate, rectangular printed circuit boards 135 include around each one of the apertures 139 a ring of conventional light emitting diodes (LEDs) 240. The LEDs provide illumination (visible preferably, but not necessarily) through apertures 210 (FIGS. 7, 10, 11A) in the elongate light diffusing rectangular plate 137 by which the LEDs are guided. The illumination falls on and is further diffused by the translucent rings 89, each of which lies in a diffusion plane located between the rack and vacuum nozzle tip. The effect is to backlight a component held on a vacuum nozzle tip 87 by a vacuum reaching through the quill. In this manner, a backlit silhouette of a component is obtained, providing maximum outline definition.

Figure 13:
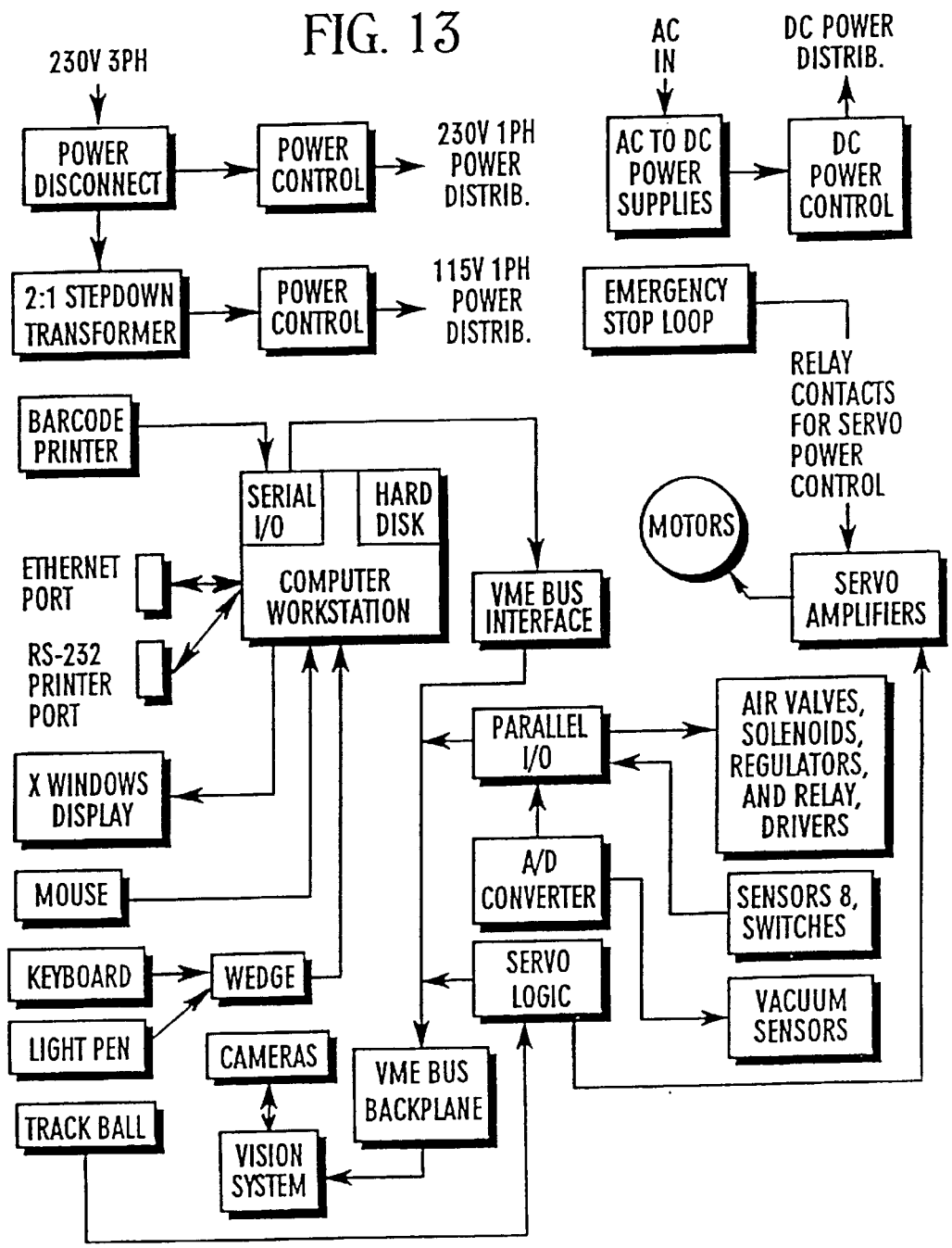
FIG. 13 is simplified block diagram of the various functional portions of a component pick and place machine incorporating the surface mount placement system according to the invention.

Refer now to FIG. 13 which is a simplified block diagram showing the functional relationships in a component pick and placement machine that incorporates the surface mount placement system of this invention. This diagram clearly describes to one skilled in the art the functional aspects of components that may be incorporated in an SMD placement system that embodies the invention for placement of surface mounted electrical components in substrates. This figure allows those skilled in the art to visualize more easily the overall functioning of the machine and is not intended to limit the invention to the particular architecture illustrated.

Figure 14:
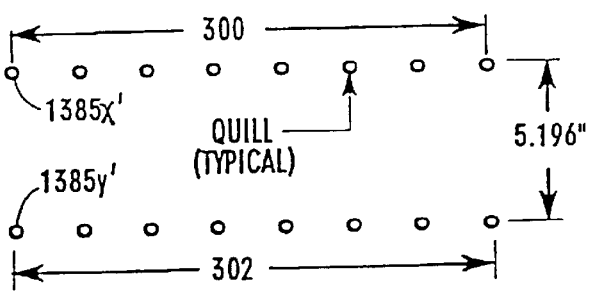
FIG. 14 is a schematic view of two rows of quills in a carriage according to the invention that shows independent movement of the quills.

FIG. 14 illustrates, in schematic form, the operation of the invention. In this regard, consider two groups of quills, each group including eight quills and mounted to a carriage on racks as described above. In the illustration, the row 300 of circles represents a rack of quills that is adjustable along the X' axis, while the row 302 represents a rack of quills that is adjustable along the Y' axis. Each circle represents the tip of a quill. All of the quills move together in X when a carriage to which they are mounted moves in X. The row 300 of quills is fixed to the carriage in the Y direction, but all quills of that row can move together in X'. Preferably the row 300 can be moved in X' by an amount equal to ±0.08 inches. At pick up, the row 300 is centered between the extremes of its adjustment. When the carriage is moved to the component placement location, the amount by which the row 300 is moved depends upon the relative correction in X' for two quills (such as the quills 1385x' and 1385y') doing simultaneous placement of components at respective locations on a substrate to correct for any X position error determined from the upward-looking camera which observes the components on the quills and for any X variation between the two intended placement locations. The other row 302 of quills is fixed to the carriage in X, but all quills in the row 302 can move together in Y' so that the distance between the rows 300 and 302 can be adjusted from a minimum of 1.0 inch to a maximum of 6.0 inch. In the preferred embodiment, at pick up, the Y separation of the rows 300, 302 is 5.196 inches. At the component placement location, the amount by which the row 302 is moved depends upon the relative correction in Y' for the two opposite quills and the separation of the intended placement locations.

All quills of the row 300 can be rotated together and all quills of the row 302 can be rotated together. In the preferred embodiment, machine control is implemented on respective pairs of quills. Preferably, each respective pair of quills comprises quills having corresponding locations in their respective rows, although the pair of quills can also include quills at non-corresponding locations. Thus, for this example, the invention contemplates placement in a single step of the components held by the pair of quills (1385$x'$, 1385$y'$). In this regard, a component held by quill 1385$x'$ is to be placed on a substrate in the component mounting zone 57 simultaneously (in a single place step) with a component held by the quill 1385$y'$. Since, in this embodiment, two components are to be placed simultaneously, gross correction in X and Y between the carriage and the substrate will not correct for differences between the two locations on the substrate where the components are to be placed simultaneously in a single step. Therefore independent adjustment of the pair of quills (1385$x'$, 1385$y'$) in X' and Y' is necessary to adjust the relative positions of the two components to be placed in the single step in order to insure accurate placement. Further, independent rotation of each quill of the pair is necessary to orient correctly the rotational angle of the component it holds with respect to the location when it is to be placed. However, since one component from each of the rows 300 and 302 is to be placed, all quills of an entire row may be rotated while the quill holding the component to be placed is rotated to the correct rotational angle with respect to the location where the component is to be placed. When X', Y', and rotational adjustments of the pair of quills (1385$x'$, 1385$y'$) are completed, each quill of the pair is moved downwardly on its Z axis to place its component. Each quill's vacuum is released, and its component is placed. The process is repeated for each pair of quills on the carriage until all components have been placed.

Manifestly, for each group of quills, the row in which the group is disposed is positionable independently on its carriage with respect to the row in which the other group is contained. Further, each quill of each group is rotatable on the carriage independently of each quill in the other group. Last, with independent Z-axis control of quill locations, every quill of each group is positionable along its Z axis, independently of every other quill, the Z axis necessarily being orthogonal to the location where the component held by the quill is to be placed.

It should be evident to those skilled in the art that, while the invention is disclosed with respect two groups of quills, it is extendable to more than two groups, so long as each group is positionable independently within the plane of the component mounting zone 57 with respect to each other group. For three groups, for example, this would mean that each group would have to be positionable independently with respect to each other group. This would require the ability of at least one group to be positionable in both X' and Y'.

Further, it should be manifest that the invention may be employed to place a single component in each place step, with each rack of a carriage being allocated for placement of components in a longitudinal substrate strip parallel to the X axis.

Moreover, relative movement between a carriage and a substrate for placement of components may be provided by movement of the carriage to and the substrate, movement of the substrate to and under the carriage, and movement of the carriage and substrate.

Further still, the invention may be practiced in a system including one carriage, two carriages, or more.

Last, the invention may be practiced on other than a split axis system.

Therefore, it should be obvious that a new and improved surface mount placement system has been described in embodiments that can be readily adapted and modified by those skilled in the art without departing from the scope of the invention.

What is claimed:

1. A surface mount placement system, comprising:
   a placement support location for receiving one or more substrates for placement of components thereon, the placement support location being aligned along two orthogonal axes, a first axis and a second axis which is orthogonal to the first axis;
   a carriage;
   a means for causing relative movement between the placement support location and the carriage;
   at least two component holder mechanisms mounted on the carriage, each component holder mechanism being positionable independently, parallel to an orthogonal axis of the two orthogonal axes, on the carriage;
   each component holder mechanism being rotatable on the carriage; and
   each component holder mechanism being moveable on the carriage along a Z axis that is substantially orthogonal to the placement support location.

2. The surface mount placement system of claim 1, further comprising first means for moving a first component holder mechanism in a first direction with respect to a second component holder mechanism, and second means for moving the second component holder mechanism in a second direction with respect to the first component holder mechanism, the second direction being substantially orthogonal to the first direction.

3. The surface mount placement system of claim 1, further comprising means for rotating at least two component holder mechanisms.

4. The surface mount placement system of claim 1, further comprising means for moving each component holder mechanism along the Z axis independently of the other component holder mechanism.

5. The surface mount placement system of claim 1, further including:
   means for moving the one or more substrates to the placement support location along the first axis of the two orthogonal axes;
   a rail structure substantially parallel to the second axis of the two orthogonal axes; and
   means on the carriage for engaging the rail structure to support movement of the carriage on the rail structure to and away from the placement support location.

6. The surface mount placement system of claim 1, wherein each component holder mechanism includes a quill with a vacuum tip assembly, each vacuum tip assembly including a tubular portion and an annular portion fixed to the tubular portion and comprising a translucent material, and further including light generating means on the carriage for illuminating the annular portion.

7. The surface mount placement system of claim 6, wherein the light generating means includes light emitting diodes.

8. The surface mount placement system of claim 1, wherein the surface mount placement system is a split axis system.

9. A carriage for use in a surface mount placement system having a component mounting zone and means for inducing relative movement between the carriage and the component mounting zone, comprising:

means for engaging the placement system;

at least two component holder mechanisms each movably mounted on the carriage, and each being independently positionable in the carriage with respect to the other;

each component holder mechanism being independently rotatable on the carriage; and each component holder mechanism being moveable on the carriage along a Z axis that is substantially orthogonal to the placement support location.

10. The carriage of claim 9, further comprising first means for rotating each component holder mechanism.

11. The carriage of claim 9, wherein each component holder mechanism includes a quill with a vacuum tip assembly, each vacuum tip assembly including a tubular portion and an annular portion fixed to the tubular portion and comprising a translucent material, and the carriage further includes light generating means for illuminating the annular portion.

12. The carriage of claim 9, further including a first group of two or more component holder mechanisms in a first row and a second group of two or more component holder mechanisms in a second row that is disposed on the carriage substantially parallel to the first row.

13. The carriage of claim 12, further comprising first means for moving the first row in a first direction and second means for moving the second row in a second direction that is orthogonal to the first direction.

14. The carriage of claim 13, wherein the surface mount placement system is a split axis system.

15. The carriage of claim 13, wherein the surface mount placement system includes orthogonal X and Y axes that intersect at the component mounting zone, the means for engaging the placement system further for moving the carriage in parallel to the X axis.

16. The carriage of claim 14, wherein the first direction is parallel to the X axis, and the second direction is parallel to the Y axis.

17. The carriage of claim 15, wherein the surface mount placement system is a split axis system.

18. The carriage of claim 13, further comprising first means for rotating the component holder mechanisms of the first row and second means for rotating the component holder mechanisms of the second row.

19. The carriage of claim 18, wherein the first means is for simultaneously rotating all component holder mechanisms of the first row and the second means is for simultaneously rotating all component holder mechanisms on the second row.

20. The carriage of claim 13, further comprising means for moving each component holder mechanism along the Z axis independently of any other component holder mechanism.

21. The carriage of claim 9, wherein each component holder mechanism includes a quill with a quill tip assembly, each quill tip assembly including a tubular portion and an annular portion fixed to the tubular portion and comprising a translucent material, the carriage further including light generating means for illuminating the annular portion.

22. The carriage of claim 21, wherein the light generating means includes light emitting diodes.

* * * * *